(12) United States Patent
Gatzemeier et al.

(10) Patent No.: US 8,400,844 B2
(45) Date of Patent: Mar. 19, 2013

(54) SYSTEM AND METHOD FOR REDUCING PIN-COUNT OF MEMORY DEVICES, AND MEMORY DEVICE TESTERS FOR SAME

(75) Inventors: Scott Gatzemeier, Alpine, UT (US); Wallace Fister, Meridian, ID (US); Adam Johnson, Boise, ID (US); Ben Louie, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/239,058

(22) Filed: Sep. 21, 2011

(65) Prior Publication Data

US 2012/0008404 A1 Jan. 12, 2012

Related U.S. Application Data

(62) Division of application No. 12/480,419, filed on Jun. 8, 2009, now Pat. No. 8,072,820, which is a division of application No. 11/891,506, filed on Aug. 10, 2007, now Pat. No. 7,554,858.

(51) Int. Cl.
*G11C 7/10* (2006.01)

(52) U.S. Cl. ......... 365/189.02; 365/189.03; 365/189.17; 365/189.18; 365/189.05

(58) Field of Classification Search ............. 365/189.02, 365/189.03, 189.17, 189.18, 189.05
See application file for complete search history.

(56) References Cited

U.S. PATENT DOCUMENTS

| | | | | |
|---|---|---|---|---|
| 4,639,919 A | | 1/1987 | Chang et al. | 714/743 |
| 4,663,735 A | * | 5/1987 | Novak et al. | 345/533 |
| 5,359,547 A | | 10/1994 | Cummins et al. | 702/119 |
| 5,790,831 A | | 8/1998 | Lin et al. | 710/315 |
| 5,808,944 A | | 9/1998 | Yoshitake et al. | 365/200 |
| 6,065,093 A | * | 5/2000 | Dell et al. | 711/105 |
| 6,131,139 A | | 10/2000 | Kikuchi et al. | 711/103 |
| 6,138,177 A | * | 10/2000 | Williams et al. | 710/8 |
| 6,275,962 B1 | | 8/2001 | Fuller et al. | 714/724 |
| 6,324,104 B1 | | 11/2001 | Matsui | 365/200 |
| 6,324,118 B1 | | 11/2001 | Ooishi | 365/233.12 |
| 6,449,679 B2 | * | 9/2002 | Ryan | 710/315 |
| 6,452,869 B1 | | 9/2002 | Parker | 365/238.5 |
| 6,578,180 B2 | | 6/2003 | Tanner | 714/734 |
| 6,670,802 B2 | * | 12/2003 | Dietrich et al. | 324/750.3 |
| 6,812,726 B1 | | 11/2004 | Ong | 324/765 |
| 6,847,203 B1 | | 1/2005 | Conti et al. | 324/158.1 |
| 6,901,494 B2 | * | 5/2005 | Zumkehr et al. | 711/167 |
| 6,968,419 B1 | * | 11/2005 | Holman | 711/5 |
| 6,971,039 B2 | * | 11/2005 | Krause et al. | 713/400 |
| 7,240,253 B2 | | 7/2007 | Yoshida et al. | 714/718 |
| 7,260,758 B1 | | 8/2007 | Agrawal et al. | 714/733 |
| 7,278,072 B2 | * | 10/2007 | Pfeiffer et al. | 714/718 |
| 7,283,418 B2 | | 10/2007 | Cullum et al. | 365/230.03 |
| 7,289,383 B2 | | 10/2007 | Cornelius | 365/226 |
| 7,313,740 B2 | | 12/2007 | Ong | 714/718 |
| 7,353,327 B1 | * | 4/2008 | Dorst | 711/104 |
| 7,405,586 B2 | * | 7/2008 | Gupta et al. | 324/762.01 |
| 7,409,612 B2 | | 8/2008 | Van De Logt et al. | 714/727 |

(Continued)

*Primary Examiner* — Viet Q Nguyen
(74) *Attorney, Agent, or Firm* — Dorsey & Whitney LLP

(57) ABSTRACT

Methods, memory devices and systems are disclosed. In one embodiment, a non-volatile memory device receives command signals through the same input/output terminals that receive address signals and write data signals and transmit read data signals. The input/output terminals are connected to a multiplexer, which is responsive to a received mode control signal to couple the input/output terminals to either a command bus or an input/output bus. A latch in the memory device latches the command signals when the mode control signal causes the input/output terminals to be coupled to the input/output bus. As a result, the command signals continue to be applied to the command bus. When the mode control signal causes the input/output terminals to be coupled to the input/output bus, write data signals are clocked into the memory device and read data signals are clocked out of the memory device responsive to a received clock signal.

25 Claims, 7 Drawing Sheets

U.S. PATENT DOCUMENTS

| | | | |
|---|---|---|---|
| 7,420,874 B2 * | 9/2008 | Kasamsetty et al. | 365/233.11 |
| 7,483,334 B2 | 1/2009 | Ha | 365/230.08 |
| 7,554,858 B2 | 6/2009 | Gatzemeier et al. | 365/189.02 |
| 7,558,131 B2 | 7/2009 | Han | 365/192 |
| 7,593,271 B2 | 9/2009 | Ong | 365/189.03 |
| 2005/0013153 A1 * | 1/2005 | Perroni et al. | 365/100 |
| 2008/0071780 A1 | 3/2008 | Ichiriu et al. | 707/6 |
| 2009/0213663 A1 | 8/2009 | Johnson | 365/189.02 |

\* cited by examiner

SYSTEM AND METHOD FOR REDUCING PIN-COUNT OF MEMORY DEVICES, AND MEMORY DEVICE TESTERS FOR SAME

CROSS-REFERENCE TO RELATED APPLICATIONS

This application is a divisional of U.S. patent application Ser. No. 12/480,419, filed Jun. 8, 2009, U.S. Pat. No. 8,072,820, which is a divisional of U.S. patent application Ser. No. 11/891,506, filed Aug. 10, 2007, U.S. Pat. No. 7,554,858. These applications and patents are incorporated by reference herein, in their entirety, for any purpose.

TECHNICAL FIELD

This invention relates generally to memory devices, and, more particularly, to a memory device and method having a reduced pin count, as well as to a memory device tester.

BACKGROUND OF THE INVENTION

Integrated circuits, such as memory devices, are housed in a package having externally accessible terminals known as "pins" for coupling power and signals to the integrated circuits and signals from the integrated circuits. The pins are internally connected to bonding pads fabricated with circuitry on a semiconductor substrate. As the level of integration continues to increase, the number of bonding pads and resulting pins in an integrated circuit can correspondingly increase. These increases in the pin count of integrated circuits can present a variety of problems. For example, a high pin count can reduce the ability to test integrated circuits in a cost-efficient manner. This problem is exemplified by a testing system 10 shown in FIG. 1 in which a tester 12 is being used to test a pair of integrated circuit NAND flash memory devices 14a,b. The tester 12 has 32 input/output (IO) terminals 16 as well as several terminals 18 on which ground and power at various voltages are output. Each NAND flash memory device 14a,b includes eight IO terminals 20, and seven command terminals 22. Address signals and write data signals are received at the IO terminals 20, and read data signals are transmitted from the IO terminals 20. The command terminals 22 receive seven respective command signals, specifically an address latch enable signal ALE, a command latch enable signal CLE, an active low chip enable signal CE#, an active low read enable signal RE#, an active low write enable signal WE#, a PRE signal and a write protect signal WP#. As is well-known in the art, the ALE signal latches an address applied to the IO terminals 20 into an address latch (not shown), the CLE signal latches a command applied to the command terminals 22 into a command latch (not shown), the CE# signal enables an access to the memory device, the RE# signal is used to clock read data from the memory device, the WE# signal is used to clock write data into the memory device, the PRE signal is used to cause the memory device to read a predetermined page of memory cells at power-up, and the WP# signal is used to prevent data stored in the memory device from being overwritten.

During testing, the power/ground terminals 18 of the tester 12 are connected to appropriate terminals of the memory devices 14a,b. The IO terminals 16 of the tester 12 are then connected to the IO terminals 20 and the command terminals 22 of the memory devices 14a,b through either the externally accessible pins of the memory devices 14a,b or through a probe card (not shown), which makes contact with bonding pads fabricated on the integrated circuit substrate of the memory devices 14a,b. To test two memory devices simultaneously, the 15 terminals (i.e., eight IO terminals 20 and seven command terminals 22) of each of the memory devices 14a,b must be connected to 30 of the 32 IO terminals 16 of the tester 12. As explained in greater detail below, the need to connect the memory devices 14a,b to the tester 12 in this manner can result in several problems and limitations.

The present inventors have determined that there is a need for a system and method for reducing the pin count of integrated circuit memory devices, as well as testing systems for interfacing with such integrated circuit memory devices.

DETAILED DESCRIPTION

Figure 1:
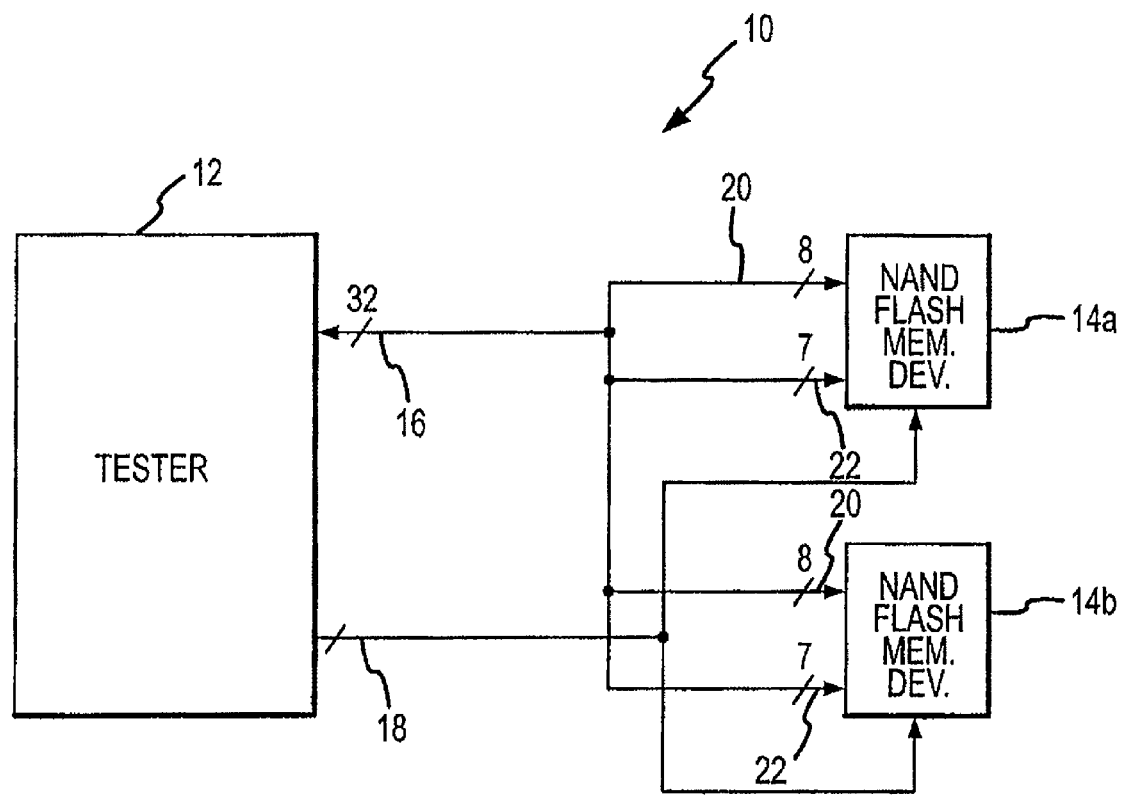
FIG. 1 is a block diagram of a prior art testing system for testing a plurality of NAND flash memory devices.

The prior art tester 12 and the NAND flash memory devices 14a,b shown in FIG. 1 can be connected to each other for testing in a variety of configurations, one of which is shown in Table 1, below:

TABLE 1

| Tester 12 | Memory Device 14a | Memory Device 14b |
|---|---|---|
| IO-0 | IO-0 | |
| IO-1 | IO-1 | |
| IO-2 | IO-2 | |
| IO-3 | IO-3 | |
| IO-4 | IO-4 | |
| IO-5 | IO-5 | |
| IO-6 | IO-6 | |
| IO-7 | IO-7 | |
| IO-8 | ALE | |
| IO-9 | CL# | |
| IO-10 | CE# | |
| IO-11 | RE# | |
| IO-12 | WE# | |
| IO-13 | PRE | |
| IO-14 | WP# | |
| IO-15 | | |
| IO-16 | | IO-0 |
| IO-17 | | IO-1 |
| IO-18 | | IO-2 |
| IO-19 | | IO-3 |
| IO-20 | | IO-4 |
| IO-21 | | IO-5 |
| IO-22 | | IO-6 |

TABLE 1-continued

| Tester 12 | Memory Device 14a | Memory Device 14b |
|---|---|---|
| IO-23 | | IO-7 |
| IO-24 | | ALE |
| IO-25 | | CL# |
| IO-26 | | CE# |
| IO-27 | | RE# |
| IO-28 | | WE# |
| IO-29 | | PRE |
| IO-30 | | WP# |
| IO-31 | | |

It will be apparent from Table 1 that the tester 12 can test only two of the NAND flash memory devices 14a,b at the same time. Conventional integrated circuit testers, such as the tester 12, are very expensive. It would therefore be desirable to be able to test more than two of the NAND flash memory devices 14a,b at the same time. For example, if the tester 12 could simultaneously test three of the NAND flash memory devices 14, the capital cost of testing could be reduced by as much as 33 percent.

The problem of integrated circuit memory devices, such as the NAND flash memory device 14, having a large pin count can also cause problems outside of the testing arena. For example, a high pin count generally results in a larger number of conductors fabricated on a substrate on which the memory device is mounted. If memory devices are mounted on the substrate with a high density, it can be difficult to provide enough room on a surface of the substrate to carry the correspondingly large number of conductors.

Figure 2:
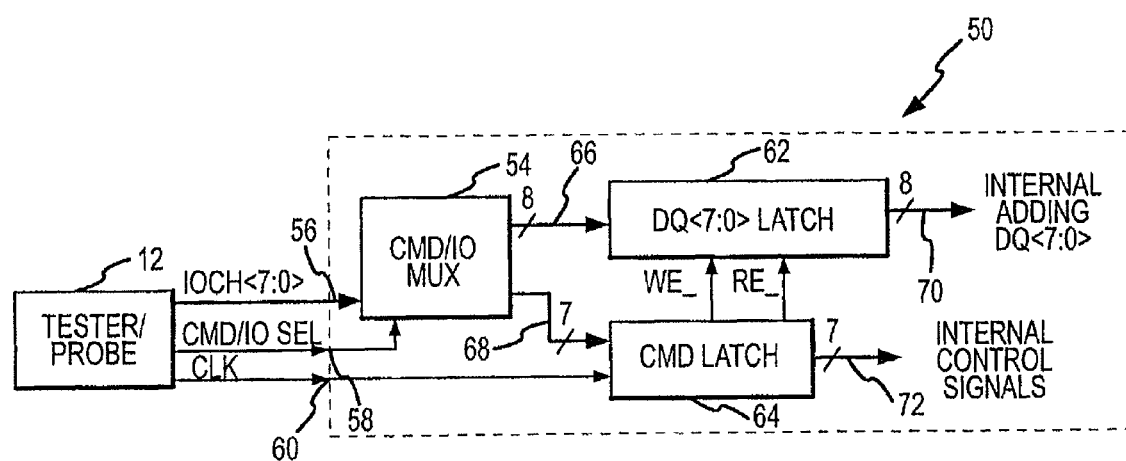
FIG. 2 is a block diagram of a multiplexing system for reducing the pin count of integrated circuit memory devices according to one example of the invention.

A multiplexing system 50 for reducing the pin count of a NAND flash memory device according to one embodiment of the invention is shown in FIG. 2. The multiplexing system 50 includes a command/input-output ("CMD/IO") multiplexer 54 that has eight externally accessible IO terminals 56. In addition, the system 50 has a terminal 58 that receives a CMD/IO control signal for the multiplexer 54 and a clock terminal 60 that receives a clock CLK signal. The CMD/IO# control signal causes the multiplexer 54 to connect the externally accessible IO terminals 56 through an IO bus 66 to an eight-input IO latch 62 or through a command bus 68 to a seven-input command latch 64. The IO latch 62 stores the received IO signals responsive to an internal WE_ signal received from the command latch 64. The TO latch 62 also stores the IO signals that are to be transmitted responsive to an internal RE_ signal received from the command latch 64. In addition to generating the internal WE and RE_ signals, the command latch 64 stores the received command signals. The IO latch 62 is connected to eight internal IO lines 70, and the command latch 64 is connected to seven internal control lines 72. The internal IO lines 70 are connected to the IO terminals of an IO control circuit (not shown) normally found in conventional flash memory devices, and the internal control lines 72 are connected to the terminals of a control logic unit (not shown) normally found in conventional flash memory devices.

In operation, when the CMD/IO# signal is high, the multiplexer 54 connects seven of the eight externally accessible IO terminals 56 to respective ones of the internal control lines 72 through the command latch 64. The IO control circuit (not shown) can then receive control signals in a conventional manner. When the CMD/IO# signal is low, the multiplexer 54 connects the eight externally accessible IO terminals 56 to respective ones of the internal IO lines 70 through the IO latch 62. However, the transition of the CMD/IO# signal from high-to-low causes the multiplexer 54 to latch the command signals so that the control signals continue to be present on the internal control lines 72 when the internal IO lines 70 are connected to the externally accessible IO terminals 56.

One potential problem with the operation of the multiplexer 54 as described above is that, when the multiplexer 54 is connecting the internal IO lines 70 to the externally accessible IO terminals 56 for the purpose of receiving read data or transmitting write data, the internal control lines 72 are isolated from the externally accessible IO terminals 56. As a result, there is no way to toggle the internal RE_ and WE_ signals present on the internal control lines 72 for the purpose of strobing the read data from the memory device or the write data into the memory device as is conventionally done to transfer write data to or read data from a memory device. This problem is solved by coupling the CLK signal to the command latch 64 and using circuitry in the command latch 64 that toggles the internal RE_ signal applied to the IO latch 62 responsive to the CLK signal if the received RE# Clken signal was low when the CMD/IO# signal transitioned from high-to-low. Similarly, circuitry in the command latch 64 toggles the WE_ applied to the IO latch 62 responsive to the CLK signal if the received WE# Clken signal was low when the CMD/IO# signal transitioned from high-to-low. As a result, write data or addresses can be clocked into the memory device and read data can be clocked from the memory device even though command signals are not being applied to the command latch 64.

Figure 3:
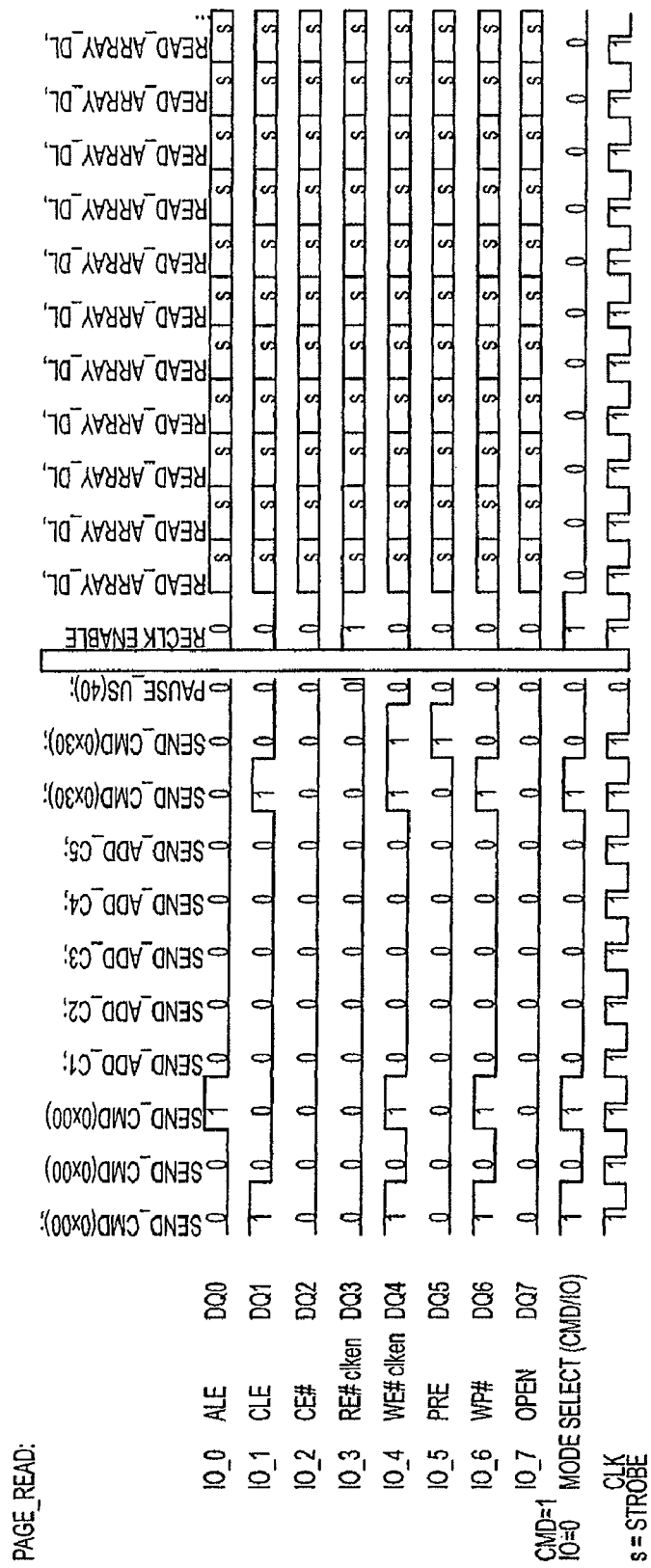
FIG. 3 is a timing diagram showing the signals applied to a memory device containing the system of FIG. 2 to perform a page read operation according to one embodiment of the invention.

The operation of the multiplexing system 50 for a page read operation is shown in FIG. 3. At time $t_0$, a stimulus ("01010010") is applied to the externally accessible IO terminals 56. The multiplexer 54 couples this stimulus to the command latch 64 because the CMD/IO# signal is high at time $t_0$, as also shown in FIG. 3. The CMD/IO# signal then transitions low prior to time $t_1$. This high-to-low transition latches the command signals as explained above, and it couples the externally accessible IO terminals 56 to the IO latch 62 so that the latch 62 can receive the command information at time $t_1$. The CMD/IO# signal then transitions high again prior to time $t_2$. During $t_2$ the command pins are conditioned to prepare for address signals at times $t_3$-$t_7$. At $t_8$, the CMD/IO# signal transitions high in preparation for the read command to be confirmed during $t_9$. During $t_8$, the RE# Clken signal transitions high with the CMD/IO# signal high to couple the high RE# Clken signal to the command latch 64. When the CMD/IO# again transitions low, the high RE# signal is latched at the input to the command latch 64. As a result, the RE_ signal that the command latch 64 applies to the IO latch 62 toggles responsive to the CLK signal, thereby clocking read data from the IO latch 62 to the externally accessible IO terminals 56 through the multiplexer 54.

Figure 4:
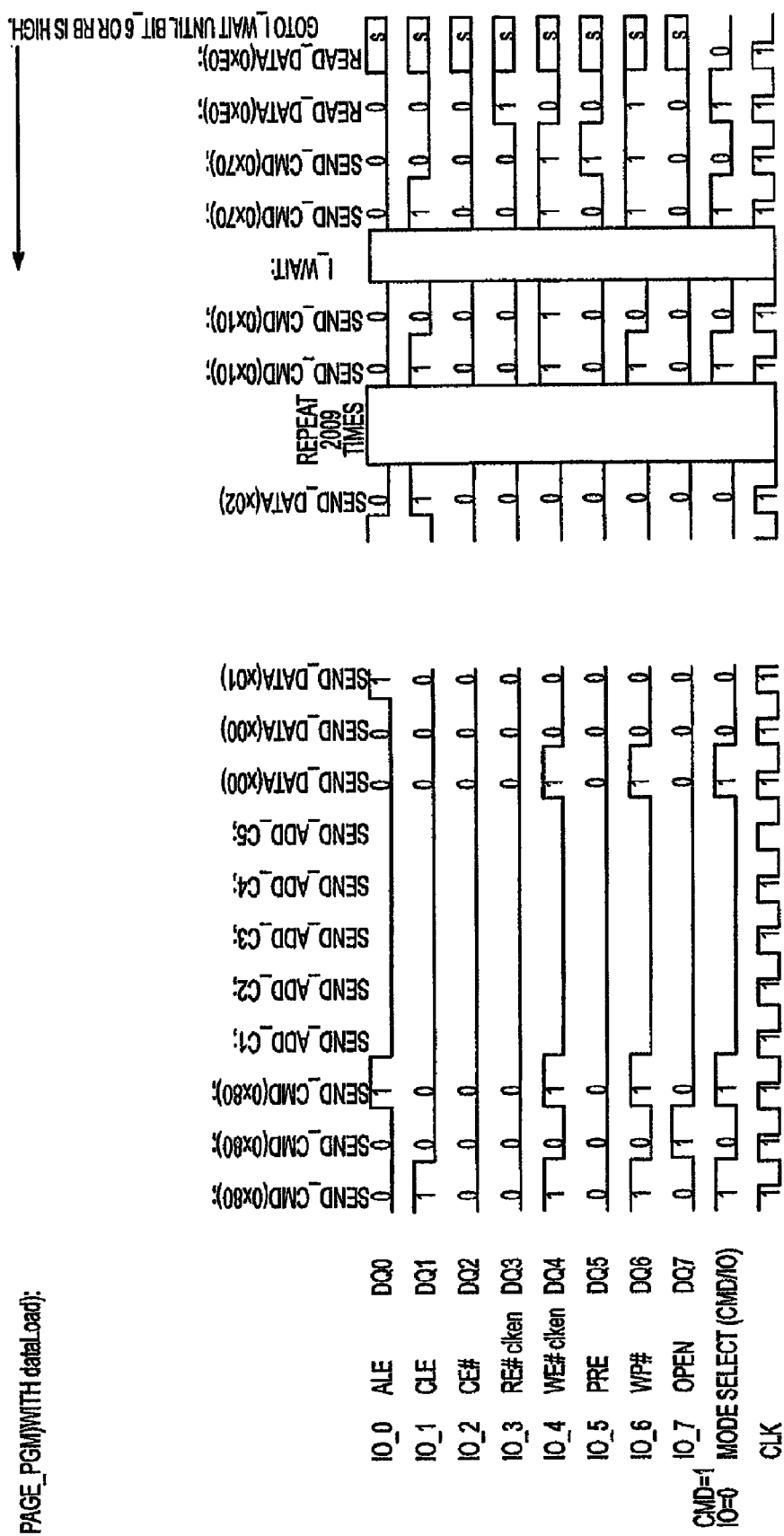
FIG. 4 is a timing diagram showing the signals applied to a memory device containing the system of FIG. 2 to perform a program operation according to one embodiment of the invention.

The operation of the multiplexing system 50 for a program operation is shown in FIG. 4. At time $t_0$, a stimulus ("01010010") is applied to the externally accessible IO terminals 56. The multiplexer 54 couples this stimulus to the command latch 64 because the CMD/IO# signal is high at time $t_0$. The CMD/IO# signal then transitions low prior to time $t_1$ to latch the command signals and couple the externally accessible IO terminals 56 to the IO latch 62 so that the latch 62 can receive the program command at $t_1$. The CMD/IO# then transitions high again to condition the IO terminals 56 to receive address signals at times $t_3$-$t_7$. At $t_8$, the CMD/IO# signal transitions high to allow the program data to be input. The WE# Clken signal transitions high with the CMD/IO# signal high to couple the high WE# Clken signal to the command latch 64. When the CMD/IO# again transitions low, the high WE# Clken signal is latched at the input to the command latch 64. As a result, the WE_ signal that the command latch 64 applies to the IO latch 62 toggles responsive to the CLK signal, thereby clocking write data into the IO latch 62 through the multiplexer 54. Once data input has been completed, the CMD/IO# signal will go high once again to condition the command latch 64 to allow for the input of the program confirm command.

Figure 5:
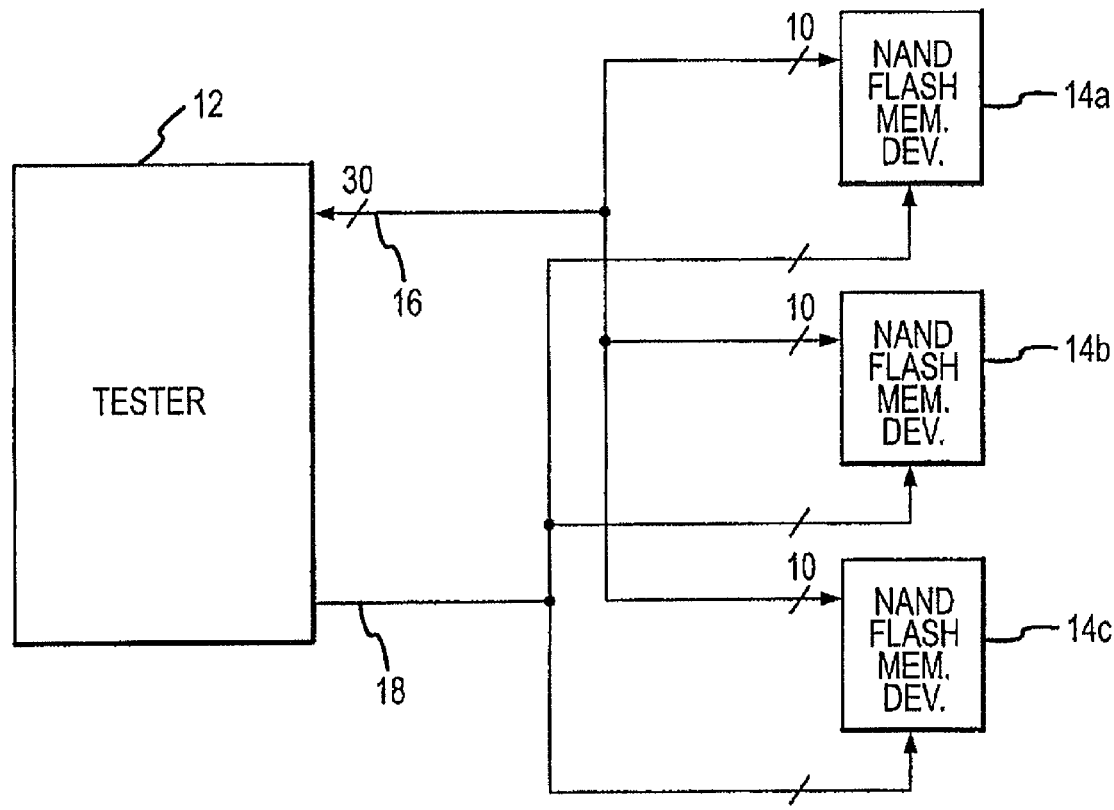
FIG. 5 is a block diagram of a testing system for testing a plurality of memory devices containing the system of FIG. 2 according to one embodiment of the invention.

The ability to multiplex command and IO signals allows the tester 12 to test a greater number of memory devices containing the multiplexing system 50. For example, as shown in FIG. 5, three memory devices 14a,b,c are connected to the tester 12 using the terminal assignment shown in Table 2, below:

TABLE 2

| Tester 12 | Memory Device 14a | Memory Device 14b | Memory Device 14c |
|---|---|---|---|
| IO-0 | IO-0 OR ALE | | |
| IO-1 | IO-1 OR CLE | | |
| IO-2 | IO-2 OR CE# | | |
| IO-3 | IO-3 OR RE# Clken | | |
| IO-4 | IO-4 OR WE# Clken | | |
| IO-5 | IO-5 OR PRE | | |
| IO-6 | IO-6 OR WP# | | |
| IO-7 | IO-7 | | |
| IO-8 | CMD/IO# | | |
| IO-9 | CLK | | |
| IO-10 | | IO-0 OR ALE | |
| IO-11 | | IO-1 OR CLE | |
| IO-12 | | IO-2 OR CE# | |
| IO-13 | | IO-3 OR RE# Clken | |
| IO-14 | | IO-4 OR WE# Clken | |
| IO-15 | | IO-5 OR PRE | |
| IO-16 | | IO-6 OR WP# | |
| IO-17 | | IO-7 | |
| IO-18 | | CMD/IO# | |
| IO-19 | | CLK | |
| IO-20 | | | IO-0 OR ALE |
| IO-21 | | | IO-1 OR CLE |
| IO-22 | | | IO-2 OR CE# |
| IO-23 | | | IO-3 OR RE# Clken |
| IO-24 | | | IO-4 OR WE# Clken |
| IO-25 | | | IO-5 OR PRE |
| IO-26 | | | IO-6 OR WP# |
| IO-27 | | | IO-7 |
| IO-28 | | | CMD/IO# |
| IO-29 | | | CLK |
| IO-30 | | | |
| IO-31 | | | |

It can be seen from Table 2 that the tester 12 is able to simultaneously test 3 of the memory devices 14a-c, thereby reducing the capital cost of testing the memory devices 14 by approximately one-third. Further reductions in the capital cost of testing may be achieved in other embodiments possibly using other testing systems by sharing the CMD/IO# and CLK signals among several memory devices rather than providing each of the memory devices 14 with its own CMD/IO# and CLK signals.

Figure 6:
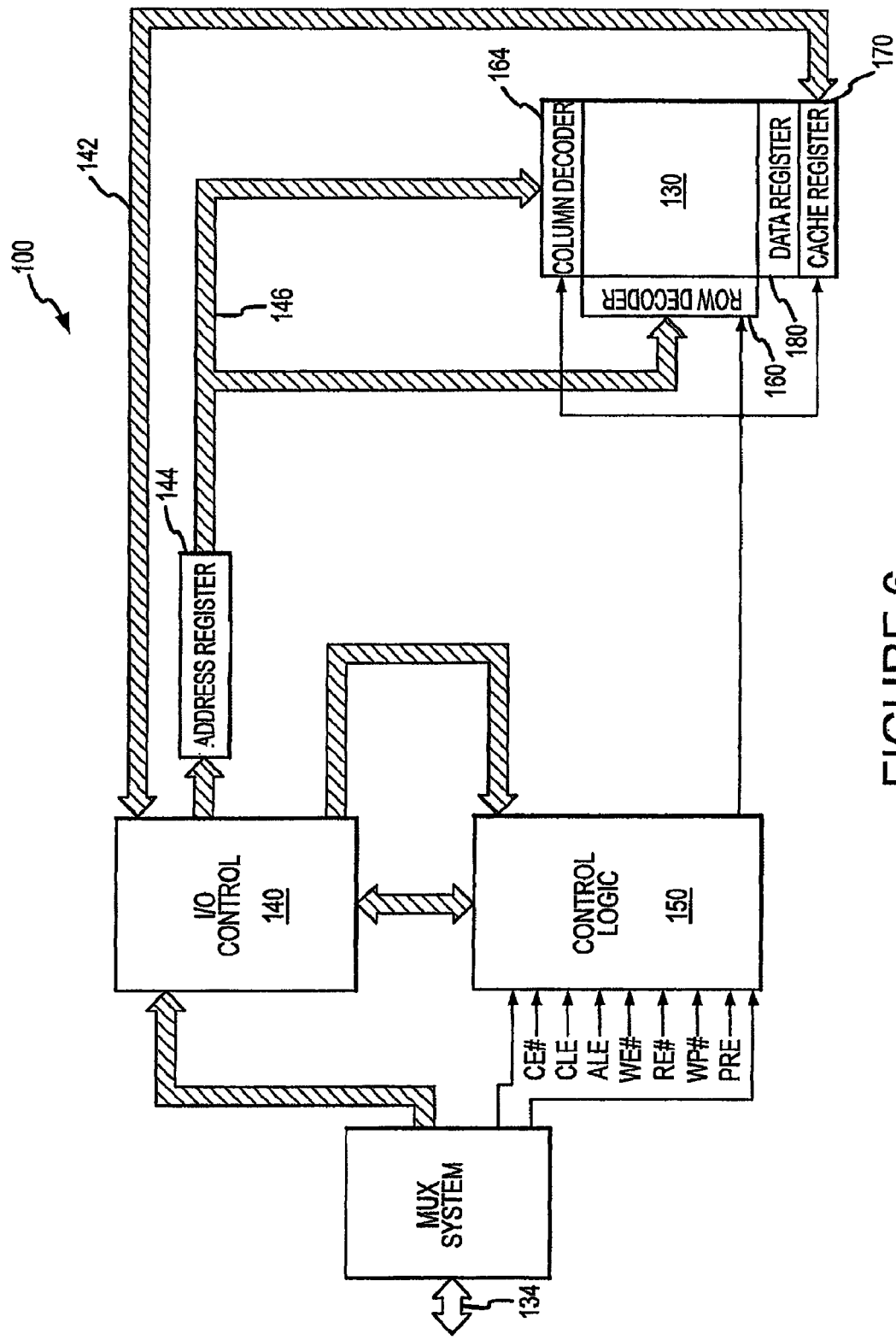
FIG. 6 is a block diagram of one embodiment of a memory device using the pin count reducing system of FIG. 2 or some other embodiment of the invention.

A NAND flash memory device 100 using the multiplexing system 50 shown in FIG. 2 is shown in FIG. 6. The flash memory device 100 includes an array 130 of flash memory cells arranged in banks of rows and columns. The address signals and the write data signals are applied to the memory device 100 as sets of sequential input/output ("I/O") signals transmitted through an I/O bus 134 and applied to the multiplexing system 50, as explained above. Similarly, read data signals are output from the flash memory device 10 to the I/O bus 134 through the multiplexing system 50. The I/O bus 134 is connected by the multiplexing system 50 to an I/O control unit 140 that routes data signals to and from an internal data bus 142 and address signals to an address register 144 for coupling to an internal address bus 146. The flash memory device 100 also includes a control logic unit 150 that receives a number of control signals from the multiplexing system 50 as explained above to control the operation of the memory device 100. The address register 144 applies row address signals to a row decoder 160, and column address signals to a column decoder 164. The row decoder 160 includes a word line driver system which drives the word lines of the memory array 130 with appropriate voltages corresponding to the decoded row address signals and the type of memory operation. Similarly, the column decoder 164 enables write data signals to be applied to bit lines for columns corresponding to the column address signals and allow read data signals to be coupled from bit lines for columns corresponding to the column address signals.

In response to the memory commands decoded by the control logic unit 150, the flash memory cells in the array 130 are erased, programmed, or read. The memory array 130 is programmed on a row-by-row or page-by-page basis. After the row address signals have been applied to the address register 144, the I/O control unit 140 routes write data signals to a cache register 170. The write data signals are stored in the cache register 170 in successive sets each having a size corresponding to the width of the internal data bus 142. The cache register 170 sequentially stores the sets of write data signals for an entire row or page of flash memory cells in the array 130. All of the stored write data signals are then used to program a row or page of memory cells in the array 130 selected by the row address coupled through the internal address bus 146. In a similar manner, during a read operation, data signals from a row or page of memory cells selected by the row address coupled through the internal address bus 146 are stored in a data register 180. Sets of data signals corresponding in size to the width of the internal data bus 142 are then sequentially transferred through the I/O control unit 140 from the data register 180 to the I/O bus 134 through the multiplexing system 50.

Figure 7:
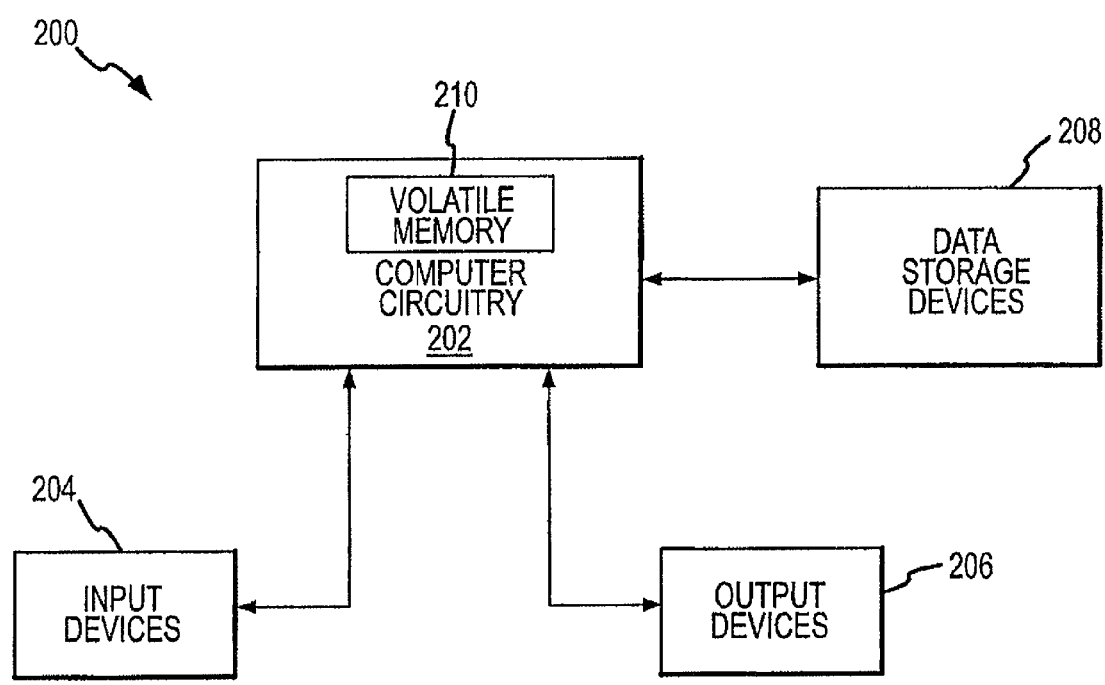
FIG. 7 is a block diagram of an embodiment of a processor-based system using the memory device of FIG. 6 or a memory device according to some other embodiment of the invention.

FIG. 7 is a block diagram of a system 200 that includes circuitry 202 having a memory device 210. The circuitry 202 is coupled through address, data, and control buses to the memory device 210 to provide for writing data to and reading data from the memory device 210. The circuitry 202 includes circuitry for performing various processing functions, such as executing specific software to perform specific calculations or tasks. The system 200 also includes one or more input devices 204 coupled to the circuitry 202 to allow an operator to interface with the system 200. Examples of input devices 204 include keypads, touch screens, and scroll wheels. The system 200 also includes one or more output devices 206 coupled to the circuitry 202 to provide output information to the operator. In one example, the output device 206 is a visual display providing visual information to the operator. A data storage device 208 is also coupled to the circuitry 202 to store data that is to be retained even when power is not supplied to the system 200 or to the data storage device 208. According to one embodiment of the invention, the data storage device 208 is implemented using the memory device 100 of FIG. 6 or a memory device according to some other embodiment of the invention.

Although the multiplexing system 50 has been explained primarily in the context of increasing the number of memory devices that can be simultaneously tested, it will be understood that the system 50 can also provide a memory device with advantages even when the memory device is not being tested.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method comprising:
receiving command signals and at least one of address signals or write data signals at a same set of terminals of a memory device;
receiving a mode control signal at a terminal of the memory device;
within the memory device, demultiplexing the received command signals from the at least one of received address signals or write data signals; and
within the memory device, performing an operation determined by the received command signals using the demultiplexed address signals and/or the write data signals;
wherein the act of demultiplexing the received command signals from the received at least one of the address signals and the write data signals comprises using the mode control signal to demultiplex the signals applied to the set of terminals of the memory device.

2. The method of claim 1 wherein the act of performing an operation determined by the received command signals using the demultiplexed address signals and/or the write data signals comprises transmitting read data signals from the same set of terminals that receive the command signals.

3. The method of claim 1, further comprising:
receiving a clock signal at a terminal of the memory device, and wherein the act of performing an operation determined by the received command signals using the at least one of the address signals and the write data signals comprises using the clock signal to strobe the read data signals from the memory device.

4. The method of claim 1, further comprising:
receiving a clock signal at a terminal of the memory device, and wherein the act of performing an operation determined by the received command signals using the at least one of the address signals and the write data signals comprises using the clock signal to strobe write data signals into the memory device.

5. The method of claim 1, further comprising:
receiving a mode control signal at a terminal of the memory device; and
wherein the act of demultiplexing the received command signals from the received at least one of the address signals and the write data signals comprises:
coupling the received command signals to a control logic unit responsive to the mode control signal having a first logic level; and
coupling the received at least one of the address signals and the write data signals to an input/output bus responsive to the mode control signal having a second logic level that is different from the first logic level.

6. The method of claim 5, further comprising receiving a mode control signal at a terminal of the memory device; and wherein the act of demultiplexing the received command signals from the received at least one of the address signals and the write data signals comprises:
latching the received command signals responsive to the mode control signal transitioning from the first logic level to the second logic level; and
continuing to apply the latched command signals to the control logic unit after the mode control signal has transitioned to the second logic level.

7. A method comprising:
receiving command signals and at least one of address signals or write data signals at a plurality of terminals;
receiving a mode control signal at a terminal;
demultiplexing the command signals from the at least one of the address signals or write data signals based, at least in part, on the mode control signal;
latching the command signals at a latch; and
providing the command signals to a control logic unit.

8. The method of claim 7, further comprising:
after said providing the command signals, performing a memory operation corresponding to the command signals,
wherein the memory operation is performed using the at least one of the address signals or write data signals.

9. The method of claim 7, wherein said latching the command signals at a latch comprises:
latching the command signals responsive, at least in part, to a select signal transitioning from a first logic state to a second logic state; and
continuing to latch the command signals responsive, at least in part, to the select signal transitioning from the second logic state to the first logic state.

10. The method of claim 7, further comprising:
providing an enable signal responsive, at least in part, to receipt of a clock signal; and
providing write data to a memory array responsive, at least in part, to receipt of the enable signal.

11. The method of claim 7, further comprising:
providing read data to the plurality of terminals.

12. A method comprising:
receiving command and address signals multiplexed on a set of externally accessible terminals;
receiving a mode control signal at a terminal;
demultiplexing the command and address signals using the mode control signal;
latching the command signals;
latching the address signals separately from the command signals; and
providing the latched command and address signals to a memory for testing the same.

13. The method of claim 12, further comprising receiving data signals multiplexed with the command and address signals on the set of externally accessible terminals.

14. The method of claim 12, further comprising providing data signals from the memory on the externally accessible terminals.

15. The method of claim 12, further comprising:
concurrently receiving, demultiplexing, latching, and providing by a plurality of memory to test the same.

16. The method of claim 12, further comprising:
receiving data signals multiplexed with the command and address signals on the set of externally accessible terminals; and
latching the data signals in a same latch used for latching the address signals.

17. A memory device, comprising:
a multiplexing system configured to receive command signals, at least one of address signals or write signals, and a mode control signal on a plurality of IO terminals, the multiplexing system further configured to demultiplex the command signals from the at least one of address signals or write signals using the mode control signal;

a control logic unit coupled to the multiplexing system and configured to receive the command signals from the multiplexing system, the control logic unit further configured to decode the command signals;

a memory array coupled to the control logic unit and configured to perform an operation responsive, at least in part, to the control logic unit decoding the command signals; and wherein the operation is performed using the at least one of address signals or write signals.

18. The memory device of claim 17, wherein the multiplexing system is configured to demultiplex the command signals from the at least one of address signals or write signals based, at least in part, on receipt of a select signal.

19. The memory device of claim 17, wherein the operation comprises at least one erasing a memory cell in the memory array, programming the memory cell in the memory array, or reading from the memory cell in the memory array.

20. The memory device of claim 17, wherein the multiplexing system is further configured to provide write data to the memory array based, at least in part, on receipt of a clock signal.

21. The memory device of claim 17, further comprising an IO control unit coupled to the multiplexing system and configured to receive the at least one of address signals or write signals, the IO control unit further configured to route the at least one of address signals or write signals to an address register responsive, at least in part, to the at least one of address signals or write signals comprising address signals and to route the at least one of address signals or write signals to a cache register responsive, at least in part, to the at least one of address signals or write signals comprising write signals.

22. A method comprising:
receiving command signals and at least one of address signals or write data signals at a same set of terminals of a memory device;
receiving a mode control signal at a terminal of the memory device;
within the memory device, demultiplexing the received command signals from the at least one of received address signals or write data signals;
within the memory device, performing an operation determined by the received command signals using the demultiplexed address signals and/or the write data signals; and wherein the act of demultiplexing the received command signals from the received at least one of the address signals and the write data signals comprises:
coupling the received command signals to a control logic unit responsive to the mode control signal having a first logic level; and
coupling the received at least one of the address signals and the write data signals to an input/output bus responsive to the mode control signal having a second logic level that is different from the first logic level.

23. The method of claim 22, further comprising:
receiving a mode control signal at a terminal of the memory device; and
wherein the act of demultiplexing the received command signals from the received at least one of the address signals and the write data signals comprises:
latching the received command signals responsive to the mode control signal transitioning from the first logic level to the second logic level; and
continuing to apply the latched command signals to the control logic unit after the mode control signal has transitioned to the second logic level.

24. A method comprising:
receiving command signals and at least one of address signals or write data signals at a plurality of terminals;
demultiplexing the command signals from the at least one of the address signals or write data signals;
latching the command signals at a latch;
providing the command signals to a control logic unit; and
wherein said latching the command signals at a latch comprises:
latching the command signals responsive, at least in part, to a select signal transitioning from a first logic state to a second logic state; and
continuing to latch the command signals responsive, at least in part, to the select signal transitioning from the second logic state to the first logic state.

25. A method comprising:
receiving command signals and at least one of address signals or write data signals at a plurality of terminals;
demultiplexing the command signals from the at least one of the address signals or write data signals;
latching the command signals at a latch;
providing the command signals to a control logic unit;
providing an enable signal responsive, at least in part, to receipt of a clock signal; and
providing write data to a memory array responsive, at least in part, to receipt of the enable signal.

* * * * *